(12) United States Patent
Gershon et al.

(10) Patent No.: US 10,121,920 B2
(45) Date of Patent: Nov. 6, 2018

(54) ALUMINUM-DOPED ZINC OXYSULFIDE EMITTERS FOR ENHANCING EFFICIENCY OF CHALCOGENIDE SOLAR CELL

(71) Applicant: INTERNATIONAL BUSINESS MACHINES CORPORATION, Armonk, NY (US)

(72) Inventors: Talia S. Gershon, White Plains, NY (US); Oki Gunawan, Westwood, NJ (US); Jeehwan Kim, Los Angeles, CA (US); Yun Seog Lee, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 423 days.

(21) Appl. No.: 14/755,803

(22) Filed: Jun. 30, 2015

(65) Prior Publication Data

US 2017/0005210 A1 Jan. 5, 2017

(51) Int. Cl.
| | |
|---|---|
| *H01L 31/0256* | (2006.01) |
| *H01L 31/0296* | (2006.01) |
| *H01L 31/032* | (2006.01) |
| *H01L 31/072* | (2012.01) |
| *H01L 31/0749* | (2012.01) |
| *H01L 31/18* | (2006.01) |

(52) U.S. Cl.
CPC .. *H01L 31/02966* (2013.01); *H01L 31/02963* (2013.01); *H01L 31/0326* (2013.01); *H01L 31/072* (2013.01); *H01L 31/0749* (2013.01); *H01L 31/1832* (2013.01); *Y02E 10/541* (2013.01)

(58) Field of Classification Search
CPC ....... H01L 31/02963; H01L 31/022475; H01L 31/0321; H01L 31/0322; H01L 31/0324; H01L 31/0323; H01L 31/0326; H01L 31/0327; H01L 31/0376
See application file for complete search history.

(56) References Cited

U.S. PATENT DOCUMENTS

| | | | |
|---|---|---|---|
| 2003/0042851 A1* | 3/2003 | Iwata | H01L 33/28 313/506 |
| 2008/0090327 A1* | 4/2008 | Yamamoto | C30B 25/02 438/102 |
| 2011/0155226 A1* | 6/2011 | Kusunoki | H01L 31/02246 136/252 |
| 2011/0168258 A1* | 7/2011 | Palm | H01L 31/0322 136/258 |

(Continued)

OTHER PUBLICATIONS

Sharbati et al. "Impact of the band offset for n—Zn(O,S)/p—Cu(In,Ga)Se2 solar cells", IEEE Journal of Photovoltaics, vol. 4, No. 2, Mar. 2014, pp. 697-702 (Year: 2014).*

(Continued)

*Primary Examiner* — Susan D Leong
(74) *Attorney, Agent, or Firm* — Tutunjian & Bitetto, P.C.; Louis J. Percello

(57) ABSTRACT

A photovoltaic device includes a substrate, a first electrode formed on the substrate and a p-type absorber layer including a chalcogenide compound. An n-type layer includes a zinc oxysulfide material having a sulfur content adjusted to match a feature of the absorber layer. A transparent contact is formed on the n-type layer.

13 Claims, 2 Drawing Sheets

(56) References Cited

U.S. PATENT DOCUMENTS

| | | | |
|---|---|---|---|
| 2012/0037201 A1 | 2/2012 | Buller et al. | |
| 2012/0222730 A1 | 9/2012 | Gunawan et al. | |
| 2013/0087190 A1 | 4/2013 | Han et al. | |
| 2013/0327391 A1 | 12/2013 | Gloeckler et al. | |
| 2014/0020744 A1 | 1/2014 | Hersh et al. | |
| 2014/0144497 A1 | 5/2014 | Kim et al. | |
| 2014/0261665 A1* | 9/2014 | Joglekar | H01L 31/0322 136/256 |
| 2014/0305499 A1 | 10/2014 | Gershon et al. | |
| 2014/0306306 A1* | 10/2014 | Gershon | H01L 31/03923 257/431 |
| 2014/0326296 A1* | 11/2014 | Park | H01L 31/065 136/252 |
| 2016/0240700 A1* | 8/2016 | Yoon | H01L 31/0296 |
| 2016/0284882 A1* | 9/2016 | Jang | H01L 31/046 |

OTHER PUBLICATIONS

Arnou, P., et al., "Aluminium-doped zinc oxide deposited by ultrasonic spray pyrolysis for thin film solar cell applications," IEEE 40th Photovoltaic Specialist Conference (PVSC), Jun. 2014. (pp. 301-313).

Kojori, H.S., et al., "Scattering and Plasmon Effect of Silver Nanoparticles in Aluminum Doped ZnO(AZO)/Si Heterojunction Solar Cell," IEEE 39th Photovoltaic Specialists Conference (PVSC), Jun. 2013. (pp. 1910-1913).

Montgomery, K.H., et al., "Development of ZnO—InP Heterojunction Solar Cells for Thin Film Photovoltaics," IEEE 40th Photovoltaic Specialist Conference (PVSC), Jun. 2014 (pp. 524-527).

Yun, J., et al., "Silver Nanoparticles Incorporated in Aluminum Doped ZnO for Heterojunction Solar Cells," 38th IEEE Photovoltaic Specialists Conference (PVSC), Jun. 1012. (pp. 2625-2627).

* cited by examiner ial Field

ALUMINUM-DOPED ZINC OXYSULFIDE EMITTERS FOR ENHANCING EFFICIENCY OF CHALCOGENIDE SOLAR CELL

BACKGROUND

Technical Field

The present invention relates to photovoltaic devices, and more particularly to formation methods and devices using absorber layers comprised of a chalcogenide compound having an aluminum-doped zinc oxysulfide emitter.

Description of the Related Art

Conventional solar cell stacks may employ Cu—Zn—Sn—S/Se (CZTSSe or CZTS) as a p-doped absorber layer. The p-CZTS is usually formed on a molybdenum (Mo) coated glass substrate. An n-type layer includes n-CdS on the CZTS layer and often includes a zinc oxide (ZnO) intrinsic layer formed thereon and with an indium tin oxide (ITO) contact. CdS has been used as the n-type layer to form a p-n junction since electron affinity of the CdS matched that of CZTS. A typical electron concentration in CdS is less than $5 \times 10^{16}$ cm$^{-3}$. This is a low concentration that limits the effectiveness of the photovoltaic cell. For example, the low concentration contributes to a substantially reduced built-in potential in the CdS/CZTS junction. In addition, open circuit voltage (Voc) is substantially reduced as well. The low Voc is suspected to be due at least to high interface recombination and possible Fermi level pinning at the interface.

SUMMARY

A photovoltaic device includes a substrate, a first electrode formed on the substrate and a p-type absorber layer including a chalcogenide compound. An n-type layer includes a zinc oxysulfide material having a sulfur content adjusted to match a feature of the absorber layer. A transparent contact is formed on the n-type layer.

Another photovoltaic device includes a substrate, a first electrode formed on the substrate and a p-type absorber layer including a chalcogenide compound comprising one of CZTSSe or CIGSSe. An n-type layer includes $Zn(O_{1-x}, S_x)$ having a sulfur content adjusted to match one or more of band alignment with adjacent layers and electron affinity of the absorber layer, wherein x is between about 0.1 to about 0.6. A transparent contact is formed on the n-type layer.

A method for forming a photovoltaic device includes forming a p-type absorber layer including a chalcogenide compound on a first electrode formed on a substrate; forming an n-type layer on the p-type absorber layer including a zinc oxide material; matching a feature of the absorber layer by doping the zinc oxide material with sulfur; and forming a transparent contact on the n-type layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
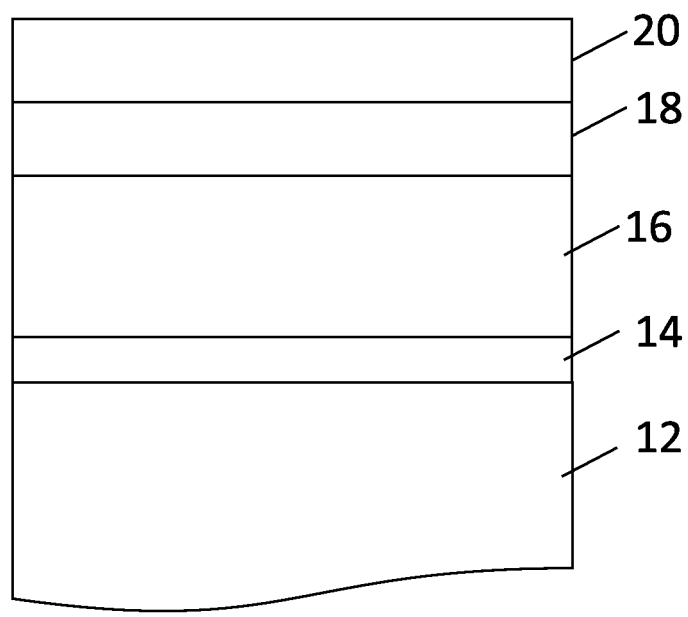
FIG. 1 is a cross-sectional view of a photovoltaic device in accordance with the present principles.

In accordance with the present principles, methods and devices are disclosed for a photovoltaic device that includes a zinc oxysulfide emitter on a chalcogenide compound absorber layer. In useful embodiments, the chalcogenide compound includes Cu—In—Ga—S/Se (CIGSSe), Cu$_2$(Zn, Sn)(S,Se)$_4$ (CZTSSe), although other chalcogenide compounds may be employed. The present principles form a zinc oxysulfide on the absorber layer as an emitter (or n-type layer). The emitter (Zn(O,S)) is formed in such a way as to match the electron affinity of the chalcogenide compound. This can be performed in one embodiment be adjusting the amount of S in the Zn(O,S) layer. The Zn(O,S) may be aluminum doped and may also be sulfur doped. The sulfur doping permits the adjustment of the emitter layer to match the absorber layer in terms of electron affinity. In some embodiments, this provides a four order of magnitude increase in carrier density in the Zn(O,S) layer as opposed to the CdS layer conventional employed. This increase in carrier density results in a substantial increase in the open circuit voltage (Voc) for the device in accordance with the present principles.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., Cu—Zn—Sn—S(Se) (CZTSSe), CIGSSe, Zn(O,S), etc. The compounds described herein may include different proportions of the elements within the compound, e.g., $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$, etc. In addition, other elements may be included in the compound, such as, e.g., dopants, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention may be employed in a tandem (multi-junction) structure having multiple layers of single crystal absorber layers transferred to a same substrate or layer. Other architectures, structures, substrate materials and process features and steps may be varied within the scope of the present invention. The tandem structure may include one or more stacked cells.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/" "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an illustrative photovoltaic structure 10 is illustratively depicted in accordance with one embodiment. The photovoltaic structure 10 may be employed in solar cells, light sensors, photosensitive devices or other photovoltaic applications. The structure 10 includes a substrate 12. The substrate 12 may include glass or other inexpensive substrates, such as metal, plastic or other material suitable for photovoltaic devices (e.g., quartz, silicon, etc.). A conductive layer 14 is formed on the substrate 12. The conductive layer 14 may include molybdenum although other high work-function materials may be employed (e.g., Pt, Au, etc.). The layer 14 provides a metal contact.

An absorber layer 16 may include a chalcogenide compound, preferably a sulfur containing chalcogenide compound. In one embodiment, absorber layer 16 includes Cu—In—Ga—S,Se (CIGSSe), $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (CZTSSe) or other suitable absorber layer materials.

Layer 16 forms the absorber layer, which may include a polycrystalline, single crystalline or amorphous structure. In one embodiment, CIGSSe is employed for layer 16 and may have a chemical formula of $CuIn_xGa_{(1-x)}Se_2$ where the value of x can vary from 1 (pure copper indium selenide) to 0 (pure copper gallium selenide). CIGSSe is a tetrahedrally bonded semiconductor, with the chalcopyrite crystal structure, and a bandgap varying continuously with x from about 1.0 eV (for copper indium selenide) to about 1.7 eV (for copper gallium selenide).

In another useful embodiment, layer 16 may include CZTSSe and more particularly $Cu_2ZnSn(S,Se)_4$. In one illustrative embodiment, layer 16 includes CZTS (or CZTS with some Se substituted for S) which provides a band gap ($E_g$) from about 1 to 1.5 eV. Although the major elements in CZTS are Cu, Zn, Sn, S, Se, reference to CZTSSe or Cu—Zn—Sn containing chalcogenide material also includes compositions that optionally contain Ge replacing some or all of the Sn and contain Fe replacing some or all of the Zn and that may also contain other dopants, including Sb, Bi, Na, K, Li, Ca, etc.

In one embodiment, the layer 16 may have a thickness of between about 0.2 to 4.0 microns and more preferably about 2 microns. Layer 16 may be grown remotely and transferred for placement on the substrate 12 coated with the conductive material 14, such as Mo.

While CIGSSe may have better performance than CZTSSe, CZTSSe has many benefits. It is low cost and environmentally harmless, being fabricated using naturally abundant materials. CZTSSe provides good optical properties and has a band-gap energy from approximately 1 to 1.5 eV, depending on the degree of substitution of S with Se, and a large absorption coefficient in the order of $10^4$ $cm^{-1}$. Reducing the reliance on rare indium metal (also heavily consumed by one of the fastest growing industries—thin film displays) opens the possibility of almost limitless material supply.

An n-type layer 18 or emitter includes Zn(O,S), and in particular Al doped Zn(O,S). In particularly useful embodiments, the amount of S is adjusted within the n-type layer 18 to match the electron affinity of the absorber layer 16. In this way, interface recombination and other junction losses are minimized. In addition, the Zn(O,S) of layer 18 is aluminum doped to increase its conductivity therefore its electron concentration. The S content in the Zn(O,S) of layer 18 may be adjusted to match the conduction band edge to that of the absorber material of layer 16.

A range of n-doping in Zn(O,S) may be achieved in layer 18, which is higher than that of conventional CdS. In one embodiment, the Zn(O,S) may be formed using an atomic layer deposition (ALD) process, although other processes may be employed, e.g., epitaxy, sputtering, metal organic chemical vapor deposition (MOCVD), etc. Doping concentrations of, e.g., greater than about $5 \times 10^{16}$ cm$^{-3}$ and more preferably greater than about $5 \times 10^{20}$/cm$^3$ can be achieved in an ALD grown Al:ZnO layer (AZO) that is later doped with S. In one embodiment, ALD is employed to form layer 18. Layer 18 includes AZO formed a temperature of between about 150 and 220 degrees C., and more preferably between 170 and 200 degrees C. Layer 18 may include a thickness of between about 80 nm to about 120 nm and preferably about 100 nm. With a 100 nm layer between about 12 and about 20 ALD cycles may be performed to achieve an optimized ALD grown AZO layer. In one example, the ALD process may include the use of a 13 cycle Zn deposition to 1 cycle Al deposition, or materials like Al may be formed directly on the ZnO and be annealed to cause diffusion of the Al to dope the ZnO.

The n-type material of layer 18 (e.g., Zn(O,S):Al) is preferably crystalline in form. This includes a monocrystalline structure and may include a multi-crystal structure or other crystalline structure (micro, nano, etc.). However, the Zn(O,S):Al material may also include amorphous phases. In one embodiment, the Zn(O,S):Al of layer 18 is amorphous.

In a particularly useful embodiment, the Zn(O,S):Al of layer 18 includes a composition of $Zn(O_{1-x}, S_x)$, where x is preferably between about 0.1 to about 0.6. The amount of the S in the Zn(O,S) can be employed to provide band alignment with the absorber layer 16, match electron infinity with the absorber layer 16 or adjust a conduction band of the Zn(O,S) layer 18. In some embodiments, the Zn(O,S) of layer 18 may include 10-30% S and 90-70% O to match work functions with the absorber layer 16.

S may be added by a doping process. S may be incorporated into ZnO:Al during deposition, e.g., during ALD. While ZnO:Al is formed by flowing diethylzinc, trimethyl-aluminum and water, S can be doped into the film by flowing H$_2$S (hydrogen sulfide) as well.

With the greater than $5 \times 10^{20}$ cm$^{-3}$ electron concentration in layer 18, about 4 orders of magnitude enhancement in carrier density is obtainable. This results in substantial Voc enhancement. In addition, fill factor is at least maintained with S doping of the layer 18 (Zn(O,S):Al) to match electron affinity with the absorber layer 16 to reduce series resistance in, e.g., solar cells.

A transparent conductive layer 20 is formed over the emitter layer 18. The transparent conductive layer 20 may include a transparent conductive oxide (TCO), such as, e.g., indium tin oxide (ITO), aluminum doped zinc oxide (AZO), boron doped zinc oxide (BZO) or other TCO materials or combinations of these or other materials. The transparent conductive layer 20 may include one or more layers. The one or more layers may include different materials, e.g., one layer may include ITO while another layer may include ZnO. The transparent conductive layer 20 may include a thickness of between about 100 nm to about 1-5 microns. Layer 20 forms a contact for the photovoltaic device 10. Other layers may be included in the structure of device 10, e.g., a buffer layer may be employed to adjust the band gap difference between layers, etc.

Metal contacts (not shown) may also be formed on the transparent conductive layer 20 to further enhance the conductive properties of the transparent conductive layer 20. The metal contacts may include, e.g., Ni, Al, Mo, Ag, Au, or any other suitable metal or alloy. Since the metal contacts would be on the front, light receiving side of the device 10, their size should be optimized to minimize shadowing loss and resistive loss.

Figure 2:
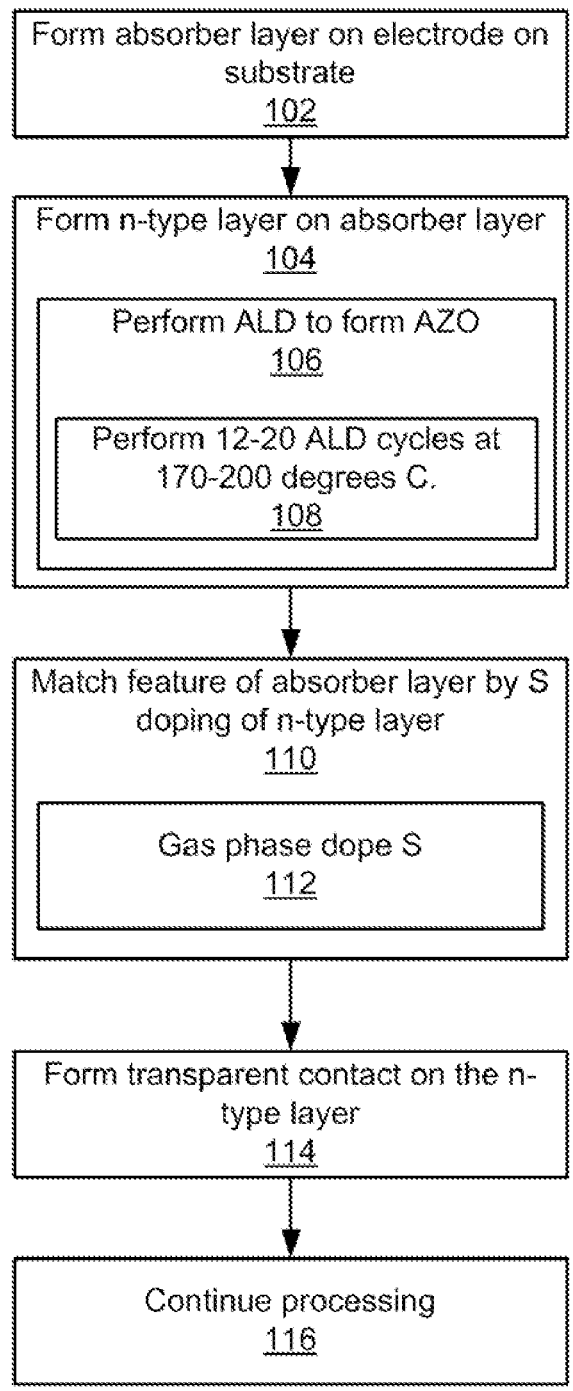
FIG. 2 is a block/flow diagram showing a method for forming a photovoltaic device in accordance with illustrative embodiments.

Referring to FIG. 2, methods for fabricating a photovoltaic device are shown in accordance with illustrative embodiments. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 102, a p-type absorber layer is formed including a chalcogenide compound. The absorber layer may include one of CZTSSe or CIGSSe. The absorber layer is formed on a first electrode, which may be formed on a substrate. The substrate may include glass or other substrate materials, and the first electrode may include a metal, such as Mo, etc.

In block 104, an n-type layer is formed on the p-type absorber layer. The n-type layer or emitter includes a zinc oxide material. In block 106, the n-type layer may be formed by performing an atomic layer deposition process to form aluminum doped zinc oxide. The n-type layer includes a carrier concentration of greater than $5 \times 10^{16}$ cm$^{-3}$ and more preferably greater than $5 \times 10^{20}$ cm$^{-3}$. In block 108, the atomic layer deposition may include between 12-20 atomic layer deposition cycles at a temperature of between about 170 to about 200 degrees C. S doping may occur during the formation of the n-type layer with ALD (block 110).

In block 110, a feature of the absorber layer is matched by doping the zinc oxide material with sulfur. The feature of the absorber layer includes one or more of band alignment and electron affinity. Other features include adjusting the conductive band of the n-type layer, etc. In block 112, in one embodiment, the doping may include a gas phase or other doping process. Doping the zinc oxide material may include forming $Zn(O_{1-x}, S_x)$, where x is between about 0.1 to about 0.6.

In block 114, a transparent contact is formed on the n-type layer. The transparent contact may include ITO, or other equivalent material. In block 116, processing may continue to complete the device.

Having described preferred embodiments for aluminum-doped zinc oxysulfide emitters for enhancing efficiency of chalcogenide solar cell (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A photovoltaic device, comprising:
   a substrate;
   a first electrode formed on the substrate;
   a p-type absorber layer including a chalcogenide compound;
   an n-type layer including a zinc oxysulfide base material, the zinc oxysulfide base material further including sulfur dopants to match a feature of the absorber layer; and
   a transparent contact formed on the n-type layer.

2. The photovoltaic device as recited in claim 1, wherein the n-type layer includes aluminum doped zinc oxysulfide.

3. The photovoltaic device as recited in claim 1, wherein the n-type layer includes a carrier concentration of greater than $5 \times 10^{20}$ cm$^{-3}$.

4. The photovoltaic device as recited in claim 1, wherein the absorber layer includes one of CZTSSe or CIGSSe.

5. The photovoltaic device as recited in claim 1, wherein the feature of the absorber layer includes one or more of band alignment and electron affinity.

6. The photovoltaic device as recited in claim 1, wherein the n-type layer includes an amorphous structure.

7. The photovoltaic device as recited in claim 1, wherein the substrate includes glass, the first electrode includes molybdenum (Mo) and the transparent contact includes indium tin oxide (ITO).

8. The photovoltaic device as recited in claim 1, wherein the n-type layer includes $Zn(O_{1-x},S_x)$, where x is between about 0.1 to about 0.6.

9. A photovoltaic device, comprising:
   a substrate;
   a first electrode formed on the substrate;
   a p-type absorber layer including a chalcogenide compound comprising one of CZTSSe or CIGSSe;
   an n-type layer including $Zn(O_{1-x},S_x)$ base material, the $Zn(O_{1-x},S_x)$ base material further including sulfur dopants to match one or more of band alignment with adjacent layers and electron affinity of the absorber layer, wherein x is between about 0.1 to about 0.6; and
   a transparent contact formed on the n-type layer.

10. The photovoltaic device as recited in claim 9, wherein the n-type layer includes aluminum doped zinc oxysulfide.

11. The photovoltaic device as recited in claim 9, wherein the n-type layer includes a carrier concentration of greater than $5 \times 10^{20}$ cm$^{-3}$.

12. The photovoltaic device as recited in claim 9, wherein the n-type layer includes an amorphous structure.

13. The photovoltaic device as recited in claim 9, wherein the substrate includes glass, the first electrode includes molybdenum (Mo) and the transparent contact includes indium tin oxide (ITO).

* * * * *